United States Patent [19]

Ueyama et al.

[11] 4,268,614
[45] May 19, 1981

[54] METHOD OF MAKING PRINTED CIRCUIT BOARD

[75] Inventors: Tamotsu Ueyama, Oyama; Yukihiko Wada, Shimodate; Masaji Homma, Shimodate; Hitoshi Aisawa, Shimodate; Takayoshi Komatsu, Shimodate; Tatsuhisa Shibata, Shimodate; Hiroharu Kamiyama, Shimodate, all of Japan

[73] Assignee: Hitachi Chemical Company, Ltd., Tokyo, Japan

[21] Appl. No.: 967,388

[22] Filed: Dec. 7, 1978

Related U.S. Application Data

[60] Division of Ser. No. 731,684, Oct. 12, 1976, abandoned, which is a continuation-in-part of Ser. No. 477,424, Jun. 7, 1974, abandoned.

[30] Foreign Application Priority Data

Jun. 7, 1973 [JP] Japan .................................. 48-64073
Aug. 22, 1973 [JP] Japan .................................. 48-93308

[51] Int. Cl.$^3$ .............................................. G03C 5/00
[52] U.S. Cl. .................................... 430/315; 430/319; 430/327
[58] Field of Search ........................... 427/98, 97, 96; 96/36.2, 38.4; 29/625; 430/313, 314, 315, 319, 327

[56] References Cited

U.S. PATENT DOCUMENTS

| | | | |
|---|---|---|---|
| 3,628,999 | 12/1971 | Schneble et al. | 427/98 X |
| 3,646,572 | 2/1972 | Burr | 427/98 X |
| 3,672,986 | 6/1972 | Schneble et al. | 427/98 X |
| 3,677,920 | 7/1972 | Kai et al. | 430/285 X |
| 3,702,284 | 11/1972 | Merkenschlager | 427/97 X |
| 3,767,398 | 10/1973 | Morgan | 430/287 X |
| 3,776,729 | 12/1973 | Levy et al. | 430/288 X |
| 3,854,973 | 12/1974 | Mersereau | 427/98 X |
| 3,929,483 | 12/1975 | Wainer | 427/98 X |
| 3,982,045 | 9/1976 | Kukanskis | 427/98 |
| 3,989,610 | 11/1976 | Tsukada et al. | 204/159.15 |
| 4,018,940 | 4/1977 | Morgan | 430/315 |

Primary Examiner—Edward C. Kimlin
Attorney, Agent, or Firm—Armstrong, Nikaido, Marmelstein & Kubovcik

[57] ABSTRACT

A novel circuit board in which circuit portions including pad portions, through-hole portions and conductors are formed, at least at the pad portions and the through-hole portions of the circuit, in the vacant portions defined by a cured photopolymeric resin composition and the vacant portions are plated with electroless copper. When only the pad portions and through-hole portions are plated with electroless copper, the conductors are all covered with the resin composition, thereby enabling fears of mechanical and chemical damages to be eliminated. When all the circuit portions are plated with electroless copper, the amount of copper required can be considerably reduced.

Such circuit board is prepared by applying onto a laminate with or without copper clad thereon a specific photopolymerizable resin composition, irradiating the resin composition-applied laminate with ultraviolet rays through a pattern mask, treating the thus irradiated laminate with a solvent to remove the unexposed portions of resin composition and applying an electroless copper plating to the unexposed portions. A durable and reliable printed circuit board having a high pecision and high density circuit pattern can be provided very simply, easily at low cost.

3 Claims, 35 Drawing Figures

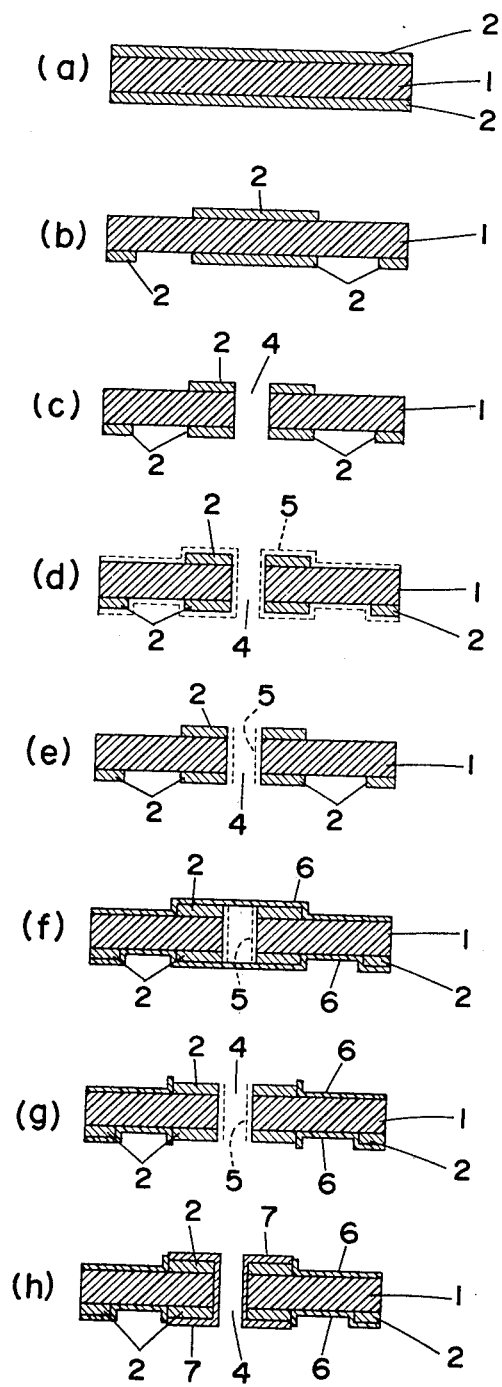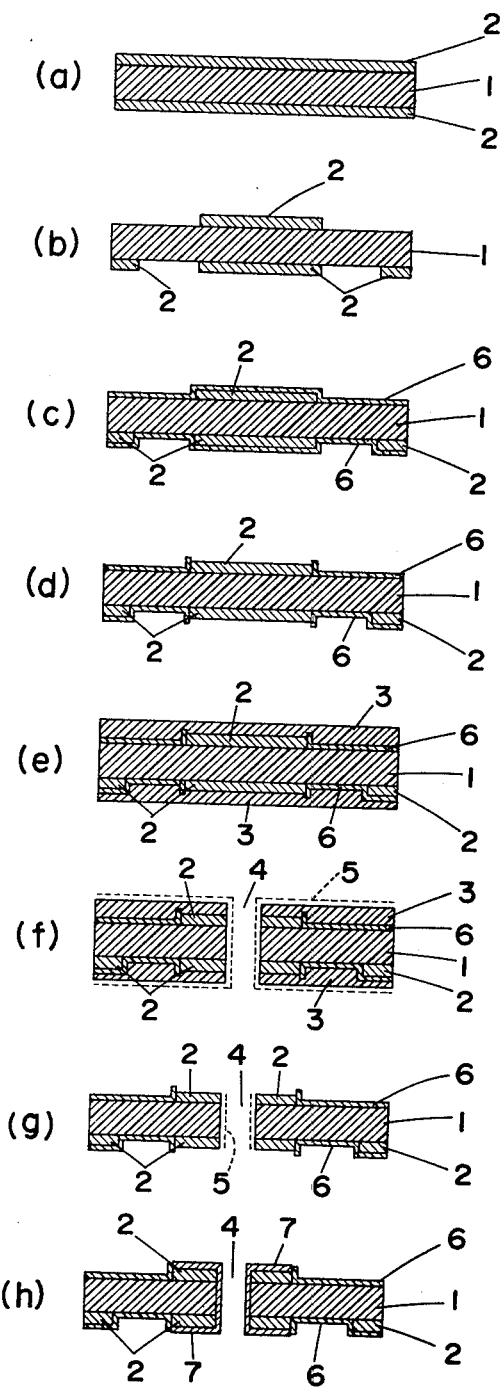

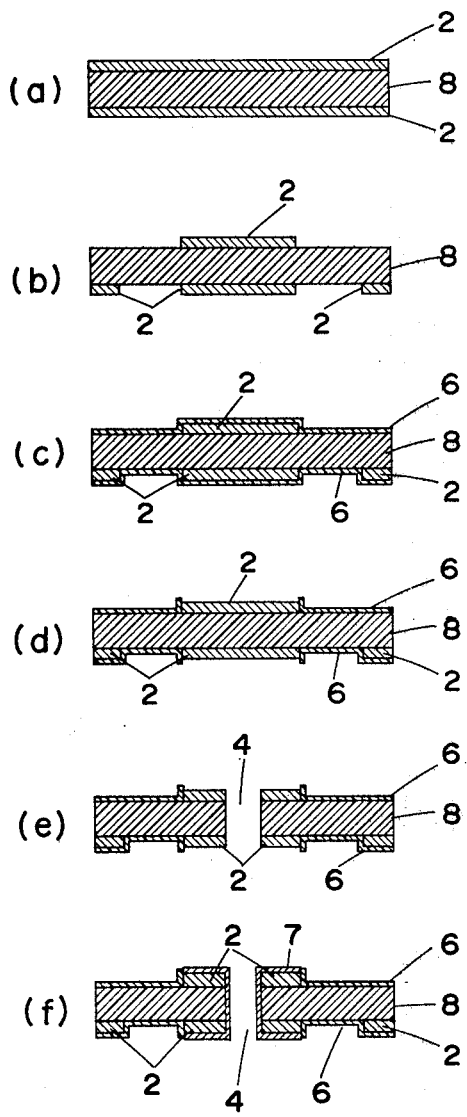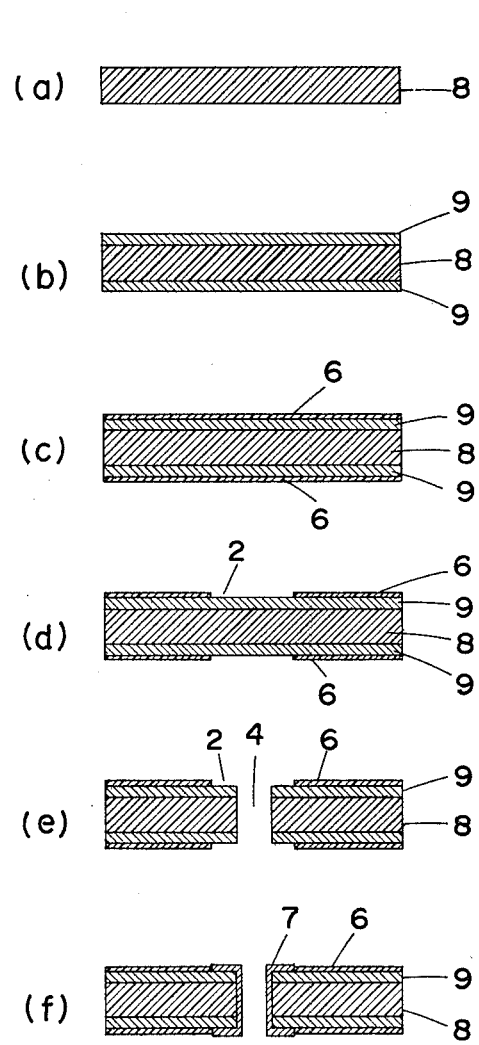

METHOD OF MAKING PRINTED CIRCUIT BOARD

This is a division of pending application Ser. No. 731,684, filed Oct. 12, 1976, now abandoned. Application Ser. No. 731,684, in turn, is a continuation-in-part of application Ser. No. 477,424, filed June 7, 1974, now abandoned.

This invention relates to improved and useful printed circuit boards and a method of making the same. More particularly, the invention relates to printed circuit boards in which an insulating laminate has on at least one side thereof a high presicion and high density pattern circuit, and to a method of making such improved printed circuit boards by employing, in combination, electroless copper plating and a specific photopolymerizable resin composition serving as an excellent resist to the electroless copper plating.

There has been rapidly developed various sophisticated electric and electronic apparatus such as computer, microcomputer, etc. Accordingly, there is a great demand for a printed circuit board having a high precision and high density pattern circuit.

In order to meet such demand, the present inventors have made extensive and intensive investigations. As a result, the present invention has been completed.

In a printed circuit board according to the present invention, the electric circuit consists essentially of pad portions, through-hole portions and conductors. The term "conductor" as used herein is intended to embrace any conductive connecting line or portion connecting pad portions and conductive connecting lines or portions with each other or one another.

The term "preliminary circuit board" as used herein is intended to mean a pre-product having the copper-clad pad portions and conductors of the electric circuit. Such pre-product can be obtained by, for example, etching a copper-clad insulating laminate according to conventional methods.

We have found that when a specific photopolymerizable resin is applied onto a laminate and irradiated with ultraviolet rays through a pattern mask, there can be formed a high precision and high density pattern film which is excellent in chemicals-resistance, solvent resistance, heat resistance, mechanical strength and insulation. Further, it has been found that when the above-mentioned photopolymeric resin film is formed on the a preliminary printed circuit board, so as to cover the overall surface including the conductors but leave the pad portions of the electric circuit and the through-hole portions formed in the pad portions uncovered for soldering working and connecting of the conductors and then, the electroless copper plating is applied to the pad portions and the through-hole portions, there can be simply, easily obtained a novel printed circuit board having a high density and high precision pattern circuit which is covered at its conductors with the cured photopolymeric resin composition. Furthermore, it has been found that when the above-mentioned photopolymeric resin film having a vacant pattern of image corresponding to the desired electric circuit is formed on an insulating laminate (without copper clad thereon) and subsequently, electroless copper plating is applied to the vacant pattern portions corresponding to the electric circuit comprising pad portions, through-hole portions and conductors, there can be simply, easily obtained a printed circuit board having a high precision and high density pattern circuit which is all plated with electroless copper.

The electric circuit of the present printed circuit board is plated at least at the pad portions and the through-hole portions thereof with electroless copper the electroless copper plating can be conducted very simply, easily and the copper deposited by electroless plating is uniform in thickness as compared with that deposited by electro-plating. Accordingly, the electroless plating is useful for making a printed circuit board having a high precision and high density pattern circuit. On the other hand, it is known that photopolymerizable resin compositions are useful for obtaining a high precision and high density pattern or image corresponding to desired electric circuit. However, conventional photopolymerizable resin composition can not be applicable to a process in which electroless copper plating is effected because an electroless copper plating solution is strongly alkaline and in addition, the plating operation should be carried out at a relatively high temperature and for a relatively long time and therefore during the electroless copper plating operation the solution attacks the cured photopolymeric resin to cause corrosion thereof.

By employing, in combination, electroless copper plating and a specific photopolymerizable resin composition capable of serving as an excellent resist to a strongly alkaline electroless copper plating solution, according to the present invention, there can be easily produced a printed circuit board having such a high precision and high density pattern circuit that there are a great number of pad portions and through-hole portions formed therein and that the width of the conductor of the circuit as well as the distance between the conductors is as small as 0.1 mm. Accordingly, it is an object of the present invention to provide an improved and useful printed circuit board having on at least one side thereof a high precision and density pattern electric circuit comprising pad portions, through-hole portions and conductors, in which said circuit is plated at least at the pad portions and through-hole portions thereof with electroless copper and said side is covered with a cured photopolymeric resin composition while the electric circuit is left uncovered at its electroless copper-plated portions.

It is another object of the present invention to provide an improved and useful printed circuit board of the above character, wherein the conductors of the electric circuit are clad with copper and covered with the cured photopolymeric resin composition with such an advantage that troubles of bridging or short-circuit of the network of electric circuit are eliminated.

It is a further object of the present invention to provide an improved and useful printed circuit board having on at least one side thereof high precision and high density pattern electric circuit comprising pad portions, through-hole portions and conductors, in which the electric circuit including the pad portions, through-hole portions and conductors is all plated with electroless copper and said side is covered with a cured photopolymeric resin composition while the electric circuit is left uncovered with such an advantage that amount of copper required for making the printed circuit board is much reduced.

It is a still further object of the present invention to provide a method of making a printed circuit board of the kind as mentioned above, which is simple and can be easily conducted at low cost.

The foregoing and other objects, features and advantages of the present invention will be apparent to those skilled in the art from the following detailed descriptions and appended claims taken in connection with the accompanying drawings, in which:

FIG. 1 shows cross sectional views explaining one form of a process for making a printed circuit board embodying the present invention;

FIG. 2 shows cross sectional views explaining another form of a process for making a printed circuit board embodying the present invention;

FIG. 3 shows cross sectional views explaining a further form of a process for making a printed circuit board embodying the present invention;

FIG. 5 shows cross sectional views explaining a still further form of a process for making a printed circuit board embodying the present invention.

Figure 4:
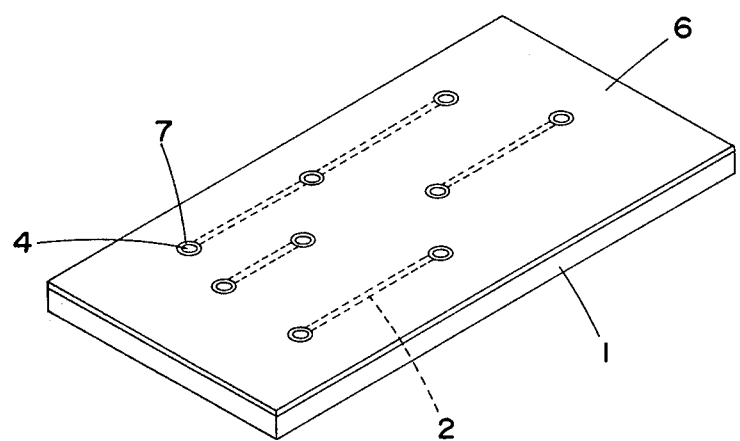
FIG. 4 is a perspective view of a board obtained by the method of FIG. 1,2 or 3.

Essentially according to the present invention, there is provided a printed circuit board which comprises an insulating laminate having on at least one side thereof an electric circuit comprising pad portions, through-hole portions and conductors: the electric circuit being plated at least at the pad portions and through-hole portions thereof with electroless copper and a cured photopolymeric resin composition covering the side of the insulating laminate, leaving the electric circuit uncovered at its electroless copper-plated portions.

Generally, the printed circuit board according to the present invention is produced by a method comprising applying onto a laminate a photopolymerizable resin composition which is adapted to be, upon irradiation with ultraviolet rays, insoluble in an organic solvent but capable of being laminated on and firmly attached to a metal or resin plate by heating while pressing at a temperature of 100° C. or more and adapted to be completely curable by heating, following irradiation with ultraviolet rays, at a temperature of 40° to 180° C.; irradiating the photopolymerizable resin composition-applied laminate with ultraviolet rays through a pattern mask to effect gellation of at least 10% by weight of said photopolymerizable resin composition of exposed portions corresponding to portions except portions in registry with at least the pad portions and through-hole portions of electric circuit and treating the irradiated laminate with an organic solvent to dissolve away the photopolymerizable resin composition from the unexposed portions to effect development of a predetermined image; and applying a copper plating to at least portions in registry with the pad portions and through-hole portions by electroless plating, at least said portions in registry with the pad portions and through-hole portions having a sensitivity to electroless plating; and wherein the photopolymerizable resin composition comprises (A) a photopolymerizable unsaturated compound having at least two terminal ethylene groups, (B) an initiator capable of initiating polymerization of the above unsaturated compound upon irradiation with ultraviolet rays, (C) a compound having at least two epoxy groups and (D) a compound selected from the group consisting of dicyandiamide, p,p'-diaminodiphenyl compounds, polycarboxylic acids having at least two carboxyl groups, polycarboxylic anhydrides and mixtures of the polycarboxylic acids and the polycarboxylic anhydrides.

As to the photopolymerizable resin compositions employable in this invention, it is requisite that they are, upon irradiation with ultraviolet rays, insoluble in an organic solvent but capable of being laminated on and firmly attached to a metal or resin plate by heating while pressing at a temperature of 100° C. or more and are completely curably by heating, following the irradiation, at a temperature of 40° to 180° C. The property of welding is necessary when the photopolymerizable resin composition is applied in the form of film. As will be mentioned later, the resin composition may also be applied in the form of solution.

Such photopolymerizable resin composition is characterized in that it comprises, (A) a photopolymerizable unsaturated compound having at least two terminal ethylene groups, (B) an initiator capable of initiating polymerization of the above unsaturated compound upon irradiation with ultraviolet rays, (C) a compound having at least two epoxy groups and (D) a compound selected from the group consisting of dicyandiamide, p,p'-diaminodiphenyl compounds, polycarboxylic acids having at least two carboxyl groups, polycarboxylic anhydrides and mixtures of the polycarboxylic acids and the polycarboxylic anhydrides (See, for example Japanese patent application Nos. 17914/1973, 80345/1973 and 105064/1973. These applications correspond to U.S. patent application Ser. No. 441,795 filed Feb. 12, 1974, now U.S. Pat. No. 3,989,610.

Examples of a photo-polymerizable unsaturated compound having at least two terminal ethylene groups include polyhydric alcohol acrylates and methacrylates, and preferable examples thereof are acrylates and methacrylates of triethylene glycol, tetraethylene glycol, ethylene glycol, propylene glycol, trimethylolpropane, pentaerythritol, neopentyl glycol and the like. Said photopolymerizable unsaturated compound also includes acrylates and methacrylates derived from modified bisphenol A, such as reaction product of acrylic acid or methacrylic acid with a bisphenol A-epichlorohydrin epoxy resin prepolymer and acrylates and methacrylates of alkylene oxide adduct of bisphenol A or its hydrogenation product. In addition to these esters, as the photopolymerizable unsaturated compound, there may also be used methylene-bis-acrylamide, methylene-bis-methacrylamide, bis-acryl- and bis-methacryl-amides of diamines, such as ethylenediamine, propylenediamine, butylenediamine, pentamethylenediamine, hexamethylenediamine, heptamethylenediamine, octamethylenediamine, etc. Furthermore, reaction products of diol monoacrylate or diol methacrylate with diisocyanate and triacryl formal or triallyl cyanurate are also employable. Besides these monomeric compounds, there may be used linear high molecular weight compounds containing acryloyloxy or methacryloyloxy group in the side chain, for example, a ring-opening copolymerization product of glycidyl methacrylate or addition reaction products of acrylic or methacrylic acid with copolymerization product of glycidyl methacrylate with a vinyl compound, such as methyl methacrylate, styrene, ethyl acrylate, methyl acrylate or butyl methacrylate.

The second component of the photosensitive resin composition is a initiator capable of initiating polymerization of the photopolymerizable unsaturated compound upon irradiation with ultraviolet rays. Preferable initiators are benzophenone, Michiler's ketone, benzoin, benzoin alkyl ethers, anthraquinone, alkyl-substituted anthraquinones, such as 2-ethylanthraquinone, 3-t-butylanthraquinone, benzil and the like.

The photopolymerizable unsaturated compound and the initiator may preferably be used in an amount of 10 to 90% by weight and 0.1 to 15% by weight, respectively, more preferably in an amount of 15 to 60% by weight and 1 to 10% by weight, respectively, based on the weight of the photopolymerizable resin composition.

Examples of the third component, namely a compound having at least two epoxy groups as an essential component, include so-called epoxy resin prepolymers, such a bisphenol A-epichlorohydrin condensate, polyolefin epoxides, novolac resin epoxides. For example, Epikote 828, Epikote 1001, Epikote 1004, Epikote 1007 (these are trademarks of Shell), Araldite ECN-1280, Araldite ECN-1273 (these are trademarks of Ciba), DEN 438, DEN 431 (these are trademarks of Dow) and Chissonox 221 and Chissonox 289 (these are trademarks of Chisso) may be used. Vinyl copolymerization products of glycidyl methacrylate may also be used. They may be employed alone or in mixture. The amount of the compound may preferably be 5 to 80% by weight, more preferably 5 to 50% by weight, based on the weight of the photopolymerizable resin composition.

The fourth component of the present composition is selected from the group consisting of dicyandiamide, p,p'-diamino-diphenyl compounds, polycarboxylic acids having at least two carboxyl groups, polycarboxylic anhydrides and mixtures of the polycarboxylic acids and the polycarboxylic anhydrides. In the case of dicyandiamide, its preferable amount is 0.1 to 20% by weight based on the weight of the composition, and its more preferable amount is 0.2 to 10% by weight based on the weight of the composition. In the case of the p,p'-diaminodiphenyl compound, it may preferably be used in an amount of 1 to 30% by weight, more preferably 2 to 20% by weight, based on the weight of the composition. Further, in the case of the polycarboxylic acid and/or the polycarboxylic anhydride, it may preferably be used in an amount of 0.3 to 1.5 moles per mole of the epoxy group of component (C) in the composition.

As the p,p'-diaminodiphenyl compound, there may preferably be used p,p'-diaminodiphenylmethane, p,p'-diaminodiphenyl ether, p,p'-diaminodiphenyl sulfone, p,p'-diaminodiphenyldimethylmethane or the like, in view of storage stability, and the mechanical and chemical properties of the cured coat or film on the laminate. These compounds may be used alone or in mixture.

Examples of the polycarboxylic anhydride to be used in the present resin composition include maleic anhydride, itaconic anhydride, succinic anhydride, citraconic anhydride, phthalic anhydride, tetrahydrophthalic anhydride, hexahydrophthalic anhydride, methyltetra-hydrophthalic anhydride, chlorendic anhydride, pyromellitic anhydride, trimellitic anhydride and copolymers of maleic anhydride or other vinyl compounds, such as methyl methacrylate, styrene, ethyl acrylate, methyl acrylate or butyl methacrylate. Examples of polycarboxylic acid include polycarboxylic acids corresponding to the above polycarboxylic anhydrides and copolymers of acrylic or methacrylic acid with other viyl compounds, such as methyl methacrylate, styrene, ethyl acrylate, methyl acrylate or butyl methacrylate. They may be used alone or in mixture.

Of the (D) components, dicyandiamide and the p,p'-diaminodiphenyl compound are more excellent in stability of composition. Particularly, dicyandiamide is most excellent. When flexibility is desired for the cured coat or film on the laminate, the p,p'-diaminodiphenyl compound is suitable.

In order to accelerate the curing reaction of the epoxy compound at a temperature of 80° C. or higher, conventional curing accelerators for epoxy resins may be added to the present photopolymerizable resin composition. The use of this accelerator is advantageous in shortening the curing time. Examples of the curing accelerator are amine-boron trifluoride complex, fluoboric acid amine salt, tetraphenylphosphonium tetraphenylborate, 2-ethyl-4-methylimidazole, 2-ethyl-4-methylimidazole-zinc octenate complex and the like. In general, the curing accelerator may be used in an amount of 0 to 5% by weight based on the weight of the epoxy compound.

In addition to the above-mentioned components, the present photopolymerizable resin compositon may contain auxiliary components for various purposes, such as a thermal polymerization inhibitor for storage stability, a linear high molecular weight binder for controlling the resolving power and mechanical strengths, for example, vinyl polymers and cellulose, and a plasticizer, for example, triethylene glycol diacetate and dioctyl phthalate. Furthermore, dyestuffs, pigments and various fillers may be added to the composition. The selection of these auxiliary components may be made with the same consideration as in the production of conventional photosensitive resin compositions.

When the fourth component is other than the polycarboxylic acid, a copolymer of acrylic or methacrylic acid with other vinyl compounds may be added as a curing accelerator for the epoxy compound to the photosensitive resin composition, to obtain a very good result.

Preferred examples of the photopolymerizable resin compositions to be employed in the present invention are given as follows. In the following compositions, all parts are by weight.

| No. 1 | |
|---|---|
| Methyl methacrylate-glycidyl methacrylate copolymer (95/5 weight ratio) | 50 parts |
| Pentaerythritol triacrylate | 25 parts |
| 2-Ethylanthraquinone | 4.0 parts |
| Epoxy resin curing agent HN-2200 (a trade name of Hitachi Chemical for a composition containing mainly 3-methyltetrahydrophthalic anhydride) | 10 parts |
| Epoxy resin (Epikote 828) | 10 parts |
| p-Methoxyphenol | 0.8 part |
| Phthalocyanine green | 0.2 part |
| Methyl ethyl ketone | 100 parts |
| No. 2 | |
| Methyl methacrylate-methacrylic acid copolymer (98/2 weight ratio) | 40 parts |
| Pentaerythritol triacrylate | 30 parts |
| Epoxy resin (DCN-1280) | 25 parts |
| Dicyandiamide | 1.5 parts |
| Benzophenone | 2.7 parts |
| Michiler's ketone | 0.3 part |
| p-Methoxyphenol | 0.6 part |
| Methyl ethyl ketone | 200 parts |
| No. 3 | |
| Diallyl phthalate prepolymer (DAPCN-M, a trade name name of Sumitomo Chemical Co., Ltd.) | 20 parts |
| Polyethylene glycol diacrylate (A-9G, a trade name of Shin Nakamura Kagaku Kabushiki Kaisha) | 10 parts |
| Pentaerythritol tetraacrylate | 15 parts |
| Epoxy resin (Epikote 828) | 5 parts |

-continued

| | |
|---|---|
| Epoxy resin (ECN-1280) | 10 parts |
| Dicyandiamide | 0.8 part |
| 2-Ethylanthraquinone | 3.0 parts |
| 2,2'-Methylenebis-(4,4'-diethyl-6,6'-di-t-butylphenol) | 0.3 part |
| Methyl ethyl ketone | 100 parts |
| No. 4 | |
| N-methoxymethylacrylamide-styrene-methyl methacrylate copolymer (10/20/70 weight ratio) | 40 parts |
| Pentaerythritol triacrylate | 15 parts |
| Tetraethylene glycol diacrylate | 10 parts |
| p-Methoxyphenol | 0.6 parts |
| Epoxy resin (ECN-1280) | 30 parts |
| Benzylamine-boron trifluoride complex | 3.0 parts |
| Victoria Pure Blue 130 | 0.1 part |
| Toluene | 120 parts |
| n-butanol | 30 parts |
| No. 5 | |
| Tetrahydrofurfuryl methacrylate-methyl methacrylate copolymer (20/80 weight ratio) | 40 parts |
| Pentaerythritol triacrylate | 30 parts |
| Epoxy resin (ENC-1280 (trade name of epoxy resin by Chiba)) | 25 parts |
| Monoethylamine-boron trifluoride complex | 2.5 parts |
| Benzophenone | 2.7 parts |
| Michiler's ketone | 0.3 part |
| p-Methoxyphenol | 0.6 part |
| Methyl ethyl ketone | 200 parts |
| No. 6 | |
| Tetrahydrofurfuryl methacrylate-Nn buthoxymethyl acrylamide-methyl methacrylate copolymer (20/5/75 weight ratio) | 40 parts |
| Pentaerythritol triacrylate | 30 parts |
| Epoxy resin (ECN - 1280) | 25 parts |
| Monoethylamine-boron trifluoride complex | 2.5 parts |
| Benzophenone | 2.7 parts |
| Michiler's ketone | 0.3 part |
| p-Methoxyphenol | 0.6 part |
| Methyl ethyl ketone | 200 parts |

Now, further detailed explanation is made on the present photopolymerizable resin composition. Such resin composition essentially contains a photocurable component and a thermosetting component. All the components of the resin composition are mixed and then reacted in a liquid phase to obtain the desired resin composition in the form of solution. The resulting reaction mixture may be used, as such, in the method of the present invention. If desired in respect of viscosity, the mixture may be employed after diluted with a suitable amount of solvent. The thus obtained resin composition is, upon exposure to active rays, especially ultraviolet rays, insoluble in an organic solvent. When the thus exposed resin composition is further subjected to heat treatment at 40° to 180° C., usually 130° to 170° C. for 180 to several minutes, it is completely cured.

According to the present invention, the above-mentioned photopolymerizable resin composition is applied onto the surface of a laminate and irradiated with ultraviolet rays through a pattern mask to effect gellation of at least 10% by weight of said photopolymerizable resin composition of exposed portions, followed by treatment with an organic solvent to dissolve away from the unexposed portions to effect development of a predetermined pattern image. The thus obtained pattern image of the photopolymeric resin composition is extremely useful as a photo resist and a resist to electroless copper plating.

In this connection, it is to be noted that if such resin pattern image is subjected to heat treatment, there is obtained a resin pattern image which is further excellent in chemicals resistance, mechanical strength and electric insulation. Further, it is noted that since the photopolymeric resin composition of the image layer has a so-called weldability at a temperature of about 100° C., or more, it can be laminated on and firmly attached to a metal or resin plate by heating while pressing.

The application of the photopolymerizable resin composition on the laminate for printed circuit board may be conducted using the photopolymerizable resin composition either in the form of solution or shaped film.

The solution of the present photopolymerizable resin composition may be prepared directly from the reaction mixture of the composition, as mentioned before. If necessary, the composition may be diluted with an organic solvent, such as methyl ethyl ketone, cyclohexanone, methylene chloride, trichloroethylene, toluene, xylene or mixture thereof. The concentration of the solution is not critical but should be regulated, in respect of viscosity of the solution, depending upon the way of coating with use of the solution. When the solution is employed, the resin composition coat layer may be formed by dipping, roll coating or spray coating. The preferred viscosity of the solution is 5 to 1,000 cps, preferbly about 100 cps for dipping; 2 to 15 ps, preferably about 10 ps; for roll coating and 2 to 15 cps, preferably 7 to 10 cps for spray coating. The preferred thickness of the resulting resin composition coat is 10 to 70$\mu$, usually 15 to 25$\mu$. The thus obtained resin coat is subjected to drying at room temperature to 120° C. for 10 hours to 5 minutes, usually at about 80° C. for 15 minutes. Drying at relatively low temperature for a long time yields good cured coat layer in which no pin hole is found.

From the solution of the present photopolymerizable resin composition, there can be easily obtained a film by the casting method. For example, the solution is flown onto a base sheet made of, for example polyethylene terephthalate or polytetrafluorethane from a slit and there can be obtained a film of the solution on the base plate by a curtain coating or knife coating method. The thus obtained film is attached onto the laminate by pressing at 80° to 180° C. under about 10 Kg/cm$^2$ in accordance with the customary method. The thickness of the film to be employed in this invention may be in the range of 5 to 100$\mu$, preferably 25 to 35$\mu$.

The laminated with a photopolymerizable resin coat is than irradiated with active rays, especially ultraviolet rays having a comparatively flat distribution of wavelengths of 0.3 to 0.5$\mu$. Irradiation intensity is at least 90 $\mu$W/cm$^2$.sec (for 500 to 600 sec.), preferably 2,500 $\mu$W/cm$^2$.sec (for 300 sec. or more) or more. With such intensity range, there can be obtained a sharp image. In other words, the desired image can be obtained with an irradiation quantity of 4,500 $\mu$W/cm$^2$. But, in view of desired precision and productivity, it is preferable to employ 5,000 $\mu$W/cm$^2$. Such irradiation can be attained by using, for example a 3 to 4 KW super-high pressure mercury lamp. Besides, there can be employed a chemical lamp, xenon lamp or Arc lamp.

As mentioned before, it is requisite to this invention to irradiate the photopolymerizable coat layer with active rays until at least 10% by weight of the resin composition of the exposed portions is gellated. With such gellation of 10% by weight or more of the resin composition, the whole resin composition of the exposed portions becomes insoluble in an organic solvent to be used in the subsequent development process.

The development, namely dissolution or removal of the photopolymerizable resin composition may be easily done at room temperature by using a suitable solvent, for example, a chlorinated hydrocarbon such as 1,1,1-trichloroethane, 1,1,1-trifluoroethane, 1,1,3,3-tetrafluoropropane or the like; or a mixed solvent such as mixture of methyl ethyl ketone and xylene (1:1) or mixture of methyl ethyl ketone, cyclohexanone and xylene (1:1:1). The most appropriate solvent may be chosen so that the desired dissolution can be attained.

Since the dissolving ability of the solvent varies depending upon the kind of photopolymerizable composition employed, it is necessary to employ a solvent having a suitable dissolving ability. For this purpose, according to necessity, there may be employed such a mixed solvent as prepared by diluting the above-mentioned solvent with a comparatively poor solvent, such as benzene, toluene, propanol or butanol. The removal of the unexposed photopolymerizable resin composition can be effected by a showering or dipping method, using the solvent. The required time may be usually about 20 to 30 seconds for showering, and about 30 seconds to 3 minutes for dipping.

Upon the development of the predetermined pattern image, the processed laminate is subjected to washing with water and then subjected to drying under a condition that the base laminated is not damaged.

Following the above procedures, the product is subjected to electroless copper plating to obtain a desired form of printed circuit board. As mentioned before, in effecting electroless copper plating, that electroless plating solution is necessarily maintained at a high temperature of about 40° to 70° C. and under high alkaline condition (pH 11 or more). For this reason, it has practically been difficult to make printed circuit boards in which the circuit portions are plated with electroless copper since there is not available suitable material capable of serving as an excellent resist to such drastic conditions of the electroless copper plating solution. Such difficulty as mentioned above is eliminated by the use of photopolymerizable resin compositions as mentioned hereinbefore. Further, due to the high resolving power of the resin composition of this invention, there can be obtained a printed circuit board having a high precision and density network of circuit. Illustratively stated, it is possible to obtain a high precision printed circuit board in which the width of the conductor or line of circuit is as small as about 0.1 mm and the distance between the circuit lines is as small as about 0.1 mm as opposed to the conventional printed circuit board in which the width of the circuit line is 0.3 mm or more. In addition, it is to be noted that the cured photopolymeric resin composition coat layer formed according to this invention is extremely excellent in chemicals-resistance and mechanical strengths and therefore, it serves as an excellent resist for electroless plating and soldering.

Prior to electroless copper plating, the laminate may be pretreated to make the surface of laminate coarse. The pretreatment may be easily done by the method in which the surface of laminate is first swollen, using an organic solvent such as trichloroethane, methyl ethyl ketone, dimethylformamide, etc. and then made coarse, using a strong oxidizing agent such as mixture of dichlormic acid and sulfuric acid, permanganic acid or chromic anhydride. After the such coarsing treatment, the sensitizer for electroless plating may be applied to the surface of laminate (See, for example, U.S. Pat. Nos. 3,672,923 and 3,672,938). After the above-mentioned pretreatment, the pattern image of cured photopolymeric resin composition may be formed according to the aforementioned method. Then, the electroless copper plating is conducted. In case of formation of copper deposit only by electroless copper plating, it is particularly necessary to make the circuit portions reliable in respect to electric connection. For this purpose, the composition of electroless copper plating bath is important. For example, the following composition of the bath is proposed:

| | |
|---|---|
| CuSO$_4$ | 0.01–0.1 mol/liter |
| EDTA | 0.7–2.5 times of Cu |
| Formaldehyde | 0.03–1.3 mol |
| pH controller (e.g. NaOH) | sufficient to control pH in the range of 11–13 |
| Water-soluble cyanide | 0.0001–0.01 mol/liter |
| Water | Balance |

With the bath having such composition, the copper deposit having excellent physical properties can be obtained. In respect of various composition suitable for electroless copper plating, Japanese patent publication No. 9454/1964, 18201/1967 and 11521/1968 are referred.

More specifically, in one aspect of the present invention, there is provided a printed circuit board which comprises an insulating laminate having on at least one side thereof an electric circuit comprising pad portions, through-hole portions and conductors: said pad portions and through-hole portions of the electric circuit being plated with electroless copper, said conductors of the electric circuit being clad with copper; and a cured photopolymeric resin composition covering the side of the insulating laminate, leaving the electric circuit uncovered at its electroless copper-plated pad portions and through-hole portions.

The above-mentioned printed circuit board is prepared by a method comprising applying onto a preliminary circuit board a photopolymerizable resin composition which is adapted to be, upon irradiation with ultraviolet rays, insoluble in an organic solvent but capable of being laminated on and firmly attached to a metal or resin plate by heating while pressing at a temperature of 100° C. or more and adapted to be completely curable by heating, following irradiation with ultraviolet rays, at a temperature of 40° to 180° C.; irradiating the photopolymerizable resin composition-applied laminate with ultraviolet rays through a pattern mask to effect gellation of at least 10% by weight of said photopolymerizable resin composition of exposed portions corresponding to portions except portions in registry with the pad portions and through-hole portions of electric-circuit and treating the irradiated laminate with an organic solvent to dissolve away the photopolymerizable resin composition from the unexposed portions to effect development of a predetermined image; and applying a copper plating to said portions in registry with the pad portions and through-hole portions by electroless plating, said pad portions and said throughhole portions having a sensitivity to electroless plating; and wherein the photopolymerizable resin composition comprises (A) a photopolymerizable unsaturated compound having at least two terminal ethylene groups, (B) an initiator capable of initiating polymerization of the above unsaturated compound upon irradiation with ultraviolet rays, (C) a compound having at least two epoxy groups and (D) a compound selected from the group consisting of dicyandiamide, p,p'-diaminodiphenyl compounds, polycarboxylic acids having at least two carboxyl groups, polycarboxylic anhydrides and mixtures of the polycarboxylic acids and the polycarboxylic anhydrides.

Referring to FIGS. 1, 2 and 3, there are shown three kinds of modes in which the method of this invention is conducted. In FIG. 1 through FIG. 3, like portions are designated with like numerals. In FIG. 1, (a) an insulating laminate 1 is clad with copper foil 2; (b) etching is effected; (c) a hole 4 is formed by drilling; (d) all the surface is treated with a sensitizer 5; (e) the sensitizer is removed out of the surface except that of hole; (f) a film 6 of photopolymerizable resin composition is attached to the overall surface and cured by irradiation with ultraviolet rays through a pattern mask, leaving portions in registry with through-hole portions and pad portions; (g) the uncured photopolymerizable resin composition is removed with organic solvent from the unexposed portions in registry with the pad portions and through-hole portions; and (h) a copper plating 7 is applied onto the through-hole portions and the pad portions by electroless plating. The resulting product is shown in FIG. 4.

Modifications in FIGS. 2 and 3 can be effected similarly to the process of FIG. 1. Three kinds of modes shown in FIG. 1, 2 and 3 are schematically shown as follows.

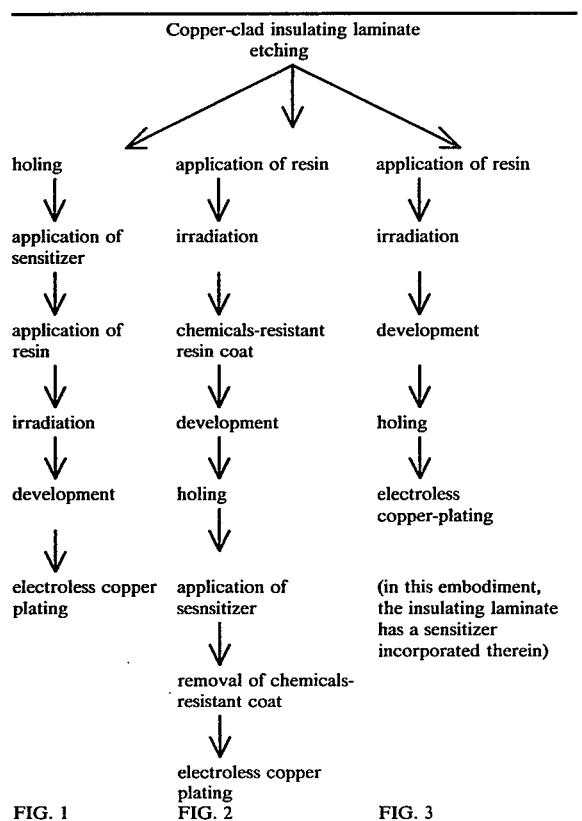

FIG. 1   FIG. 2   FIG. 3

In the method of FIG. 2, the chemicals-resistant resin coat 3 (e.g. phenolic resin is formed before application of the sensitizer. This coat serves to prevent the sensitizer from being applied onto the unnecessary portion. In the method of FIG. 3, the insulating laminate 8 has a sensitizer incorporated therein. The pretreatment or sensitization of the laminate is required to render it catalytic to the reception of the electroless deposition of copper (See for example, U.S. Pat. Nos. 3,546,009 and 3,672,938, and Japanese Patent Application Publication No. 21434/1970).

All the materials and the processes in this method are the same as those described hereinbefore.

The conventional printed circuit board has a circuit conductor exposed to the outside. Accordingly, not only the mechanical damages tend to often occur but also there is a fear of chemical damages, such as oxidation and corrosion. Such damages are observed during the course of manufacture as well as during the use. In order to prevent such drawbacks, it has conventionally been proposed to plate a metal gold or solder on a circuit conductor. With such plating, good result is not obtained.

As described before, according to the instant embodiment, the through-hole portions and pad portions are electrolessly copper-plated and the other portions of the laminate including the conductors of the electric circuit, namely the electric circuit except the pad portions and through-hole portions are covered with the cured photopolymeric resin composition. Thus, the drawbacks is completely eliminated. With such coated printed circuit board, fears of mechanical damages and chemical damages such as oxidation and corrosion of the circuit conductor are eliminated. In addition, soldering operation can be effected without bridging because the circuit except the pad portions and through hole portions are covered under the cured polymeric resins of this invention. Further, insulation property of the board is improved. Thus, there is obtained the high precision and density printed circuit board having high durability.

In another aspect of the present invention, there is provided a printed circuit board which comprises an insulating laminate having on at least one side thereof an electric circuit comprising pad portions, through-hole portions and conductors: the pad portions, through-hole portions and conductors of the electric circuit being plated with electroless copper; and a cured photopolymeric resin composition covering the side of the insulating laminate, leaving the electric circuit uncovered.

The above-mentioned printed circuit board is prepared by a method comprising applying onto an insulating laminate without copper clad thereon a photopolymerizable resin composition which is adapted to be, upon irradiation with ultraviolet rays, insoluble in an organic solvent but capable of being laminated on and firmly attached to a metal or resin plate by heating while pressing at a temperature of 100° C. or more and adapted to be completely curable by heating, following irradiation with ultraviolet rays, at a temperature of 40° to 180° C.; irradiating the photopolymerizable resin composition-applied laminate with ultraviolet rays through a pattern mask to effect gellation of at least 10% by weight of said photopolymerizable resin composition of exposed portions corresponding to portions in registry with circuit portions including pad portions, through-hole portions and conductors and treating the irradiated laminate with an organic solvent to dissolve away the photopolymerizable resin composition from the unexposed portions to effect development of a predetermined image; and applying a copper plating to said portions in registry with the pad portions and through-hole portions and conductors by electroless plating, said portions in registry with the pad portions, through-hole portions and conductors having a sensitivity to electroless plating; and wherein the photopolymerizable resin composition comprises (A) a photopolymerizable unsaturated compound having at least two terminal ethylene groups, (B) an initiator capable of initiating polymerization of the above unsaturated compound upon irradiation with ultraviolet rays, (C) a compound having at least two epoxy groups and (D) a compound selected from the group consisting of dicyandiamide, p,p'-diaminodiphenyl compounds, polycarboxylic acids having at least two carboxyl groups, polycarboxylic anhydrides and mixtures of the polycarboxylic acids and the polycarboxylic anhydrides.

The instant embodiment is directed to a so-called additive methods in which the circuit comprising pad portions, through-hole portions and conductors is formed only by electroless copper plating without use of a copper-clad laminate.

Figure 6:
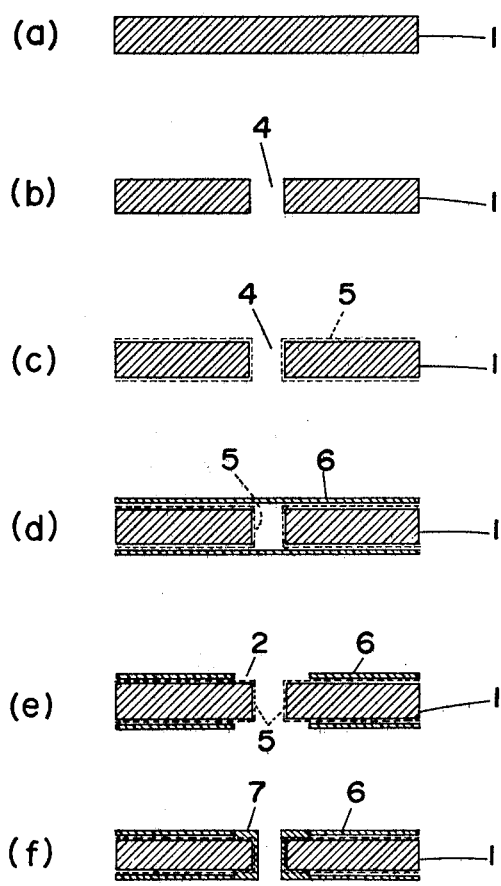
FIG. 6 shows cross sectional views explaining a still further form of a process for making a printed circuit board embodying the present invention.

Now, two modes of the instant embodiment of this invention are explained referring to FIGS. 5 and 6. In FIGS. 5 and 6, like portions or parts are designated with like numerals which are used to designate the same portions or parts as those in FIGS. 1 through 4. In the method of FIG. 5, (a) an insulating laminate 8 has a sensitizer incorporated therein; (b) an adhesive 9 with a sensitizer incorporated therein is coated on all the surface of laminate, (c) a photopolymerizable resin composition film 6 is applied onto the adhesive layer, (d) the film 6 applied laminate is irradiated with ultraviolet rays and treated with an organic solvent to effect development of a circuit pattern image having portions 2 corresponding to pad portions; (e) through-holes 4 are formed by drilling; and (f) an electroless copper plating 7 is applied onto circuit portions corresponding to the unexposed portions. A modification as shown in FIG. 6 can be effected similarly to the process of FIG. 5. Two kinds of modes in FIGS. 5 and 6 are schematically shown as follows:

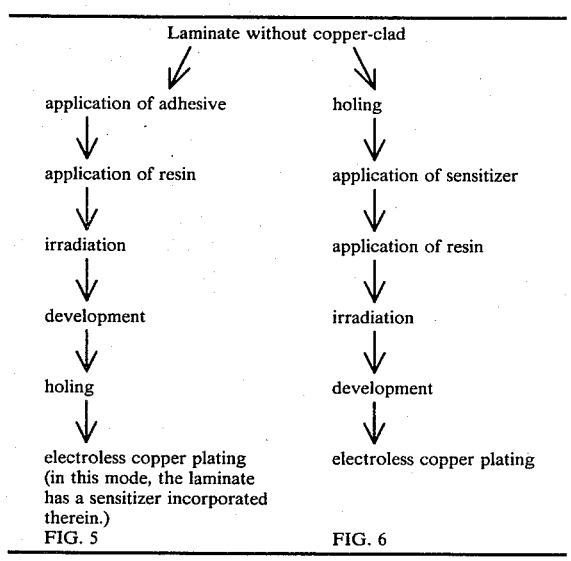

FIG. 5 / FIG. 6

In the method of FIG. 5, (a) a sensitized laminate as used in FIG. 3 is used and (b) further advantageously the adhesive incorporating therein a sensitizer is applied. In the method of FIG. 5, (a) the laminate is not sensitized previously and therefore (c) a sensitizer is applied on the laminate after holing. In the instant embodiment, the electric circuit including pad portions, through-hole portions and conductors is all formed by electroless copper plating and the other portions than the circuit is covered with cured photopolymeric resin composition. Due to the excellent properties inherent of the specific photopolymerizable resin compositions used as well as the prominent effect of electroless copper plating, there can be obtained a high precision and high density circuit pattern. Further, in this embodiments the electric including pad portions, through-hole portions and conductors can be formed by electroless copper plating in one step. Therefore, the printed circuit board can be prepared very simply, easily while considerably reducing the amount of copper required.

The following examples are given only for illustrative purposes, and should not be construed as limiting the invention.

EXAMPLE 1

Reference is made to FIG. 1.

7 sheets of prepregs prepared by impregnating a glass cloth G-9018 (trade name of a glass cloth manufactured and sold by Nitto Boseki K. K. ) with EPIKOTE 1001 (trade name of an epoxy resin manufactured and sold by Shell Chemical Corp.), were put one on another to form a laminate. On both sides of the laminate, electrolytic copper foils having a thickness of 35$\mu$ were put, heated and pressed in a usual manner to form a copper-clad laminate of a thickness of 1.6 mm—Process (a). The thus obtained copper-clad laminate was subjected to etching (etching agent: an aqueous solution of ammonium persulfate) to form an electric circuit—Process (b). At predetermined portions in the circuit, 1 mm$\phi$-throughholes were formed using a high speed numerical control drill (manufactured and sold by Hitachi Seiko K. K.)—Process (c). The thus fabricated copper-clad laminate was subjected to a sensitizing treatment. For this purpose, the copper-clad laminate was dipped in 1000 ml of a seeder or a sensitizing agent which is a solution composed of 1 g. of palladium chloride, 60 g. of stannous chloride, 100 ml. of 37% hydrochloric acid and the balance of water—Process (d). After completion of the sensitizing treatment, the sensitizer applied on the surfaces of laminate was removed by brushing, leaving the sensitizer on the inner walls of throughholes—Process (e). A photopolymerizable resin composition film having a thickness of 30$\mu$ was prepared by casting a photopolymerizable resin composition No. 1 as described in the specification. The resin composition film was attached onto the both surfaces of laminate—Process (f). The photopolymerizable resin composition film coated on the laminate was then irradiated with ultraviolet rays through a predetermined pattern mask, using a 4 KW super high pressure mercury lamp at an intensity of 5000 $\mu$W/cm$^2$ for 120 sec. After the irradiation, the laminate was dipped in 1,1,1-trichloroethane to remove the uncured photopolymerizable resin composition film at the unexposed portions corresponding to pad portions of the circuit. The laminate was subjected to washing with water and then subjected to drying, followed by heat treatment at 150° C. for 5 minutes to completely cure the exposed portions of resin composition film—Process (g). The thus treated laminate was then subjected to electroless copper plating by dipping in an electroless copper plating solution bath having the same formulation as described in the specification, at a temperature of 69° C. for about 25 hours to effect copper deposition on the through-hole portions and the pad portions. The obtained copper deposit was 30μ in thickness—Process (h).

EXAMPLE 2

Reference is made to FIG. 5.

Onto both sides of a glass cloth-epoxy resin laminate having a thickness of 1.5 mm and having palladium incorporated therein (manufactured by Hitachi Chemical Co., Ltd.), were applied an adhesive HA-04 (trade name of an epoxy-phenol-nitrile rubber adhesive having palladium incorporated therein, manufactured and sold by Hitachi Chemical Co., Ltd.) in a thickness of 30μ by dipping—Processes (a), (b). Photopolymerizable resin composition having the same composition as No. 2 as described in the specification was coated on the laminate in a thickness of 30μ by roll coating—Process (c). The laminate coated with the photopolymerizable resin composition film was subjected to irradiation, development (removal of unexposed portions of the photopolymerizable resin compositions) and heat-treatment in the same manner as described in Example 1—Process (d). At predetermined portions on the laminate, 1 mmϕ-through-holes were drilled by using a high speed numerical control drill as used in Example 1—Process (e). Whereupon, the laminate was subjected to electroless copper plating in the same manner as described in Example 1 to effect copper deposition in a thickness of 30μ on overall circuit portions including the pad portions, the through-hole portions and the conductors—Process (f).

The test results on the obtained circuit boards are shown as follows.

What is claimed is:

1. A method of making a printed circuit board having on at least one side thereof an electric circuit comprising pad portions, through-hole portions and conductors, which comprises the following steps (A), (B), (C), (D) and (E):

(A) providing an insulating laminate having copper-clad conductor portions and pad portions on at least one surface thereof;

(B) subsequent to step (A) and prior to step (E), forming through-holes in said insulating laminate having inner walls corresponding to the through-hole portions of said electric circuit;

(C) applying a photopolymerizable resin composition onto said at least one surface of said laminate, the photopolymerizable resin composition: (1) comprising (A) a photopolymerizable unsaturated compound having at least two terminal ethylene groups, (B) an initiator capable of initiating polymerization of the above unsaturated compound upon irradiation with actinic rays, (C) a compound having at least two epoxy groups and (D) a compound selected from the group consisting of dicyandiamide, p,p'-diaminodiphenyl compounds, polycarboxylic acids having at least two carboxyl groups, polycarboxylic anhydrides and mixtures of the polycarboxylic acids and the polycarboxylic anhydrides and (2) being adapted to be, upon irradiation with actinic rays, insoluble in an organic solvent but capable of being laminated on and firmly attached to a metal or resin plate by heating while pressing at a temperature of 100° C. or more and adapted to be completely curable by heating, following irradiation with actinic rays, at a temperature of 40° to 180° C., whereby a coat of the resin composition is formed on said at least one surface of said laminate;

| | | | | Results | |
|---|---|---|---|---|---|
| Test Item | Test Method | Treating Condition | Unit | FIG. 1 | FIG. 5 |
| Peel strength | JIS C-6481 | As received | Kg/cm | 1.9–2.1 | 1.9–2.1 |
| | | After put on a solder of 260° C. for 10 sec. | " | 2.0–2.2 | 1.9–2.2 |
| Solder float | JIS C-6481 260° C. | As received | Sec. | 60 or more | 60 or more |
| Insulation resistance | JIS C-6481 | As received | Ω | $1-5 \times 10^{13}$ | $1-2 \times 10^{13}$ |
| | | After dipped in boiling water of 100° C. for 2 hrs. | " | $2-8 \times 10^{10}$ | $0.5 \times 10^{11}$ |
| Dissipation factor (1 MHZ) | JIS C-6481 | As received | — | 0.024–0.025 | 0.022–0.026 |
| | | In water of 50° C. for 48 hrs. | — | 0.028–0.034 | 0.029–0.031 |
| Dielectric constant (1 MHZ) | JIS C-6481 | As received | — | 4.8–5.0 | 4.9–5.1 |
| | | After dipped in water of 50° C. for 48 hrs. | — | 5.1–5.3 | 5.1–5.5 |
| Connection reliability of copper-plated through-holes | Measurement of series resistance of 1150 holes | MIL-202D-107C | — | After 50 cycles, OK | After 50 cycles, OK |
| | Hole diameter: 1.0 mm, board thickness: 1.6 mm, conductor length: 7500 mm Conducter width: 0.5 mm | Dipping in a 260° C. hot Oil for 10 sec.<br>↓ ↑<br>Room temperature | — | After 10 cycles, OK | After 10 cycles, OK |
| Dielectric breakdown voltage | Pressure elevation rate: 100 V/sec. | As received | KV | 3.4–3.6 | 1.0–1.5 |
| | Toothed pattern of 1.0 × 400 mm with spaces of 1.5 mm | After 3 cycles of standing at 40° C. and 90% RH for 14 days<br>↓ ↑<br>Standing at room temperature under atmospheric pressure for 14 days | " | 3.0–3.3 | 0.9–1.2 |

(D) irradiating the coat of the photopolymerizable resin composition on the laminate with actinic rays through a pattern mask to expose said coat to the actinic rays except at those portions corresponding to the pad portions and through-hole portions of said electric circuit whereby at least 10% by weight of said photopolymerizable resin composition of the exposed portions gels; trating the irradiated laminate with an organic solvent to dissolve away the photopolymerizable resin composition from the unexposed portions corresponding to the position of the pad portions and through-hole portions to effect development of a predetermined image; and (E) applying an electroless copper plating only onto the pad portions and through-hole portions, said pad portions and through-hole portions having a sensitivity to electroless plating.

2. A method according to claim 1, wherein the photopolymerizable resin composition comprises, by weight, 10–90% of said (A); 0.1–15% of said (B); 5–80% of said (C); and 0.1–20% of dicyandiamide, or 1–30% of a p,p'-diaminodiphenyl compound, or 0.3–1.5 moles per mole of the epoxy group of said (C) of the polycarboxylic acid and/or polycarboxylic anhydride, the weight % being based on the photopolymerizable resin composition.

3. A method according to claim 1, wherein the component (A) is a methyl methacrylate-methacrylic acid copolymer and pentaerythritol triacrylate, the component (B) is benzophenone and Michler's ketone, the component (C) is a novolak resin epoxide and the component (D) is dicyandiamide.

* * * * *